United States Patent
Merrill et al.

(10) Patent No.: US 6,538,520 B1
(45) Date of Patent: Mar. 25, 2003

(54) METHODS AND APPARATUS FOR PRODUCING A REFERENCE FREQUENCY SIGNAL WITH USE OF A REFERENCE FREQUENCY QUADRUPLER HAVING FREQUENCY SELECTION CONTROLS

(75) Inventors: Allen Carl Merrill, Encinitas, CA (US); Joseph James Balardeta, Carlsbad, CA (US); Wei Fu, San Diego, CA (US); Mehmet Eker, Santee, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

(21) Appl. No.: 09/982,156

(22) Filed: Oct. 18, 2001

(51) Int. Cl.$^7$ .............................. H03B 19/00; H03L 7/06
(52) U.S. Cl. ........................... 331/18; 331/1 A; 331/74; 331/175; 327/116; 327/122; 327/159
(58) Field of Search ............................. 331/1 A, 16, 18, 331/25, 74–76, 175; 327/114–116, 119–123, 156–159; 332/127; 360/51; 375/376; 455/260

(56) References Cited

U.S. PATENT DOCUMENTS 5,241,285 A * 8/1993 Jackson ...................... 331/1 A

* cited by examiner

*Primary Examiner*—David C. Mis
(74) *Attorney, Agent, or Firm*—Gray Cary Ware & Freidenrich; Terrance A. Meador

(57) ABSTRACT

Circuitry for a phase locked loop (PLL) includes a first frequency doubler; a first equalizer having an input coupled to an output of the first frequency doubler; a second frequency doubler having an input coupled to an output of the first equalizer; and a second equalizer having an input coupled to an output of the second frequency doubler and an output which is fed into the PLL. Each frequency doubler includes a first delay circuit having an input coupled to the input of the frequency doubler; and an XOR circuit having a first input coupled to an output of the delay circuit and a second input coupled to the input of the frequency doubler. The combination of the two frequency doublers in series quadruples the reference signal into the PLL, which allows the, PLL to have a smaller feedback divider ratio and a higher loop gain for reducing jitter. Advantageously, controls for the selection of the initial reference signal are provided.

20 Claims, 3 Drawing Sheets

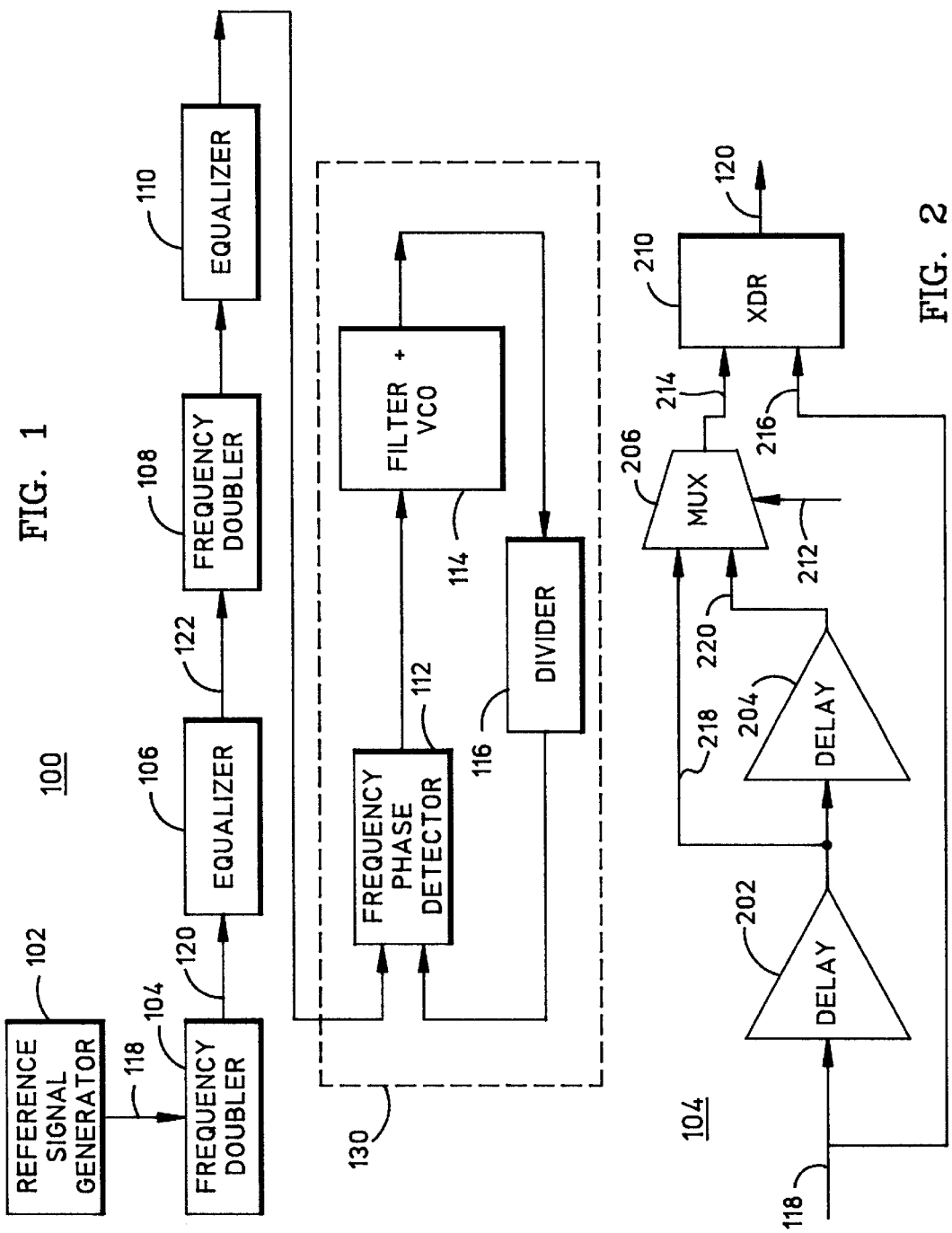

METHODS AND APPARATUS FOR PRODUCING A REFERENCE FREQUENCY SIGNAL WITH USE OF A REFERENCE FREQUENCY QUADRUPLER HAVING FREQUENCY SELECTION CONTROLS

BACKGROUND OF THE INVENTION

1. Field of the Invention

The present invention relates generally to producing a reference frequency signal for a phase locked loop (PLL), and more particularly to methods and apparatus for producing a reference frequency signal for a PLL with use of a reference frequency quadrupler.

2. Description of the Related Art

A conventional phase locked loop (PLL) typically includes a frequency phase detector which receives a reference signal, a filter, a voltage-controlled oscillator (VCO), and a divider circuit. If the reference signal received by the frequency phase detector has a relatively low frequency, a large feedback divider ratio is required by the PLL. A large feedback divider ratio requires that the divider circuit have a relatively large number of dividers, which undesirably introduces phase "jitter" into the signals. The large feedback divider ratio also means that the loop gain of the PLL will be lower for a given supply voltage, which makes the gain distribution for noise less ideal and also increases jitter.

One solution to this problem is to increase the frequency of the reference signal received by the frequency phase detector. However, conventional XOR-based frequency doublers typically distort the duty cycle of reference signals due to integrated circuit (IC) process variations. This distortion may be severe enough to render the approach ineffective.

SUMMARY OF THE INVENTION

According to the present invention, circuitry for a phase locked loop (PLL) includes a first frequency doubler; a first equalizer having an input coupled to an output of the first frequency doubler; a second frequency doubler having an input coupled to an output of the first equalizer; and a second equalizer having an input coupled to an output of the second frequency doubler and an output which is fed into the PLL. Each one of the frequency doublers includes a delay circuit having an input coupled to the input of the frequency doubler; and an XOR circuit having a first input coupled to an output of the delay circuit and a second input coupled to the input of the frequency doubler.

The combination of the two frequency doublers in series quadruples the reference signal into the PLL. The first equalizer helps restore the duty cycle of the signal before it enters the second frequency doubler, and the second equalizer helps restore the duty cycle before the signal enters the PLL. The increased (quadrupled) reference frequency allows the PLL to have a smaller feedback divider ratio and therefore fewer dividers; fewer dividers result in less circuitry in the PLL feedback path which reduces jitter. A reduced divider ratio also allows a higher loop gain for a given supply voltage, which produces a more ideal gain distribution for noise and reduces jitter as well. Importantly as well, controls for the selection of the initial reference signal are advantageously provided.

BRIEF DESCRIPTION OF THE DRAWINGS

FIG. 1 is a schematic block diagram of the present invention for use with a phase locked loop (PLL);

FIG. 2 is a schematic block diagram of a frequency doubler of FIG. 1;

DETAILED DESCRIPTION OF THE PREFERRED EMBODIMENTS

Figures 3A, 3B, 3C, 4:
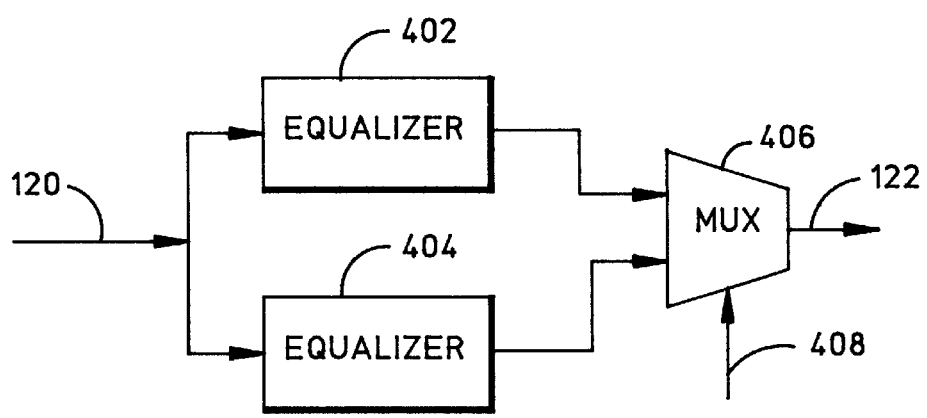
FIGS. 3A–3C are graphs of reference signals at various locations in the diagram of FIG. 2.
FIG. 4 is a schematic block diagram of an equalizer of FIG. 1.

According to the present invention, circuitry for a phase locked loop (PLL) includes a first frequency doubler; a first equalizer having an input coupled to an output of the first frequency doubler; a second frequency doubler having an input coupled to an output of the first equalizer; and a second equalizer having an input coupled to an output of the second frequency doubler and an output which is fed into the PLL. Each one of the frequency doublers includes a delay circuit having an input coupled to the input of the frequency doubler; and an XOR circuit having a first input coupled to an output of the delay circuit and a second input coupled to the input of the frequency doubler. The combination of the two frequency doublers in series quadruples the reference signal into the PLL, which allows the PLL to have a smaller feedback divider ratio and a higher loop gain for reducing jitter. Advantageously, controls for the selection of the initial reference signal are provided.

FIG. 1 is a schematic block diagram of circuitry 100 of the present invention. Circuitry 100 may be embodied in an integrated circuit (IC) device. Circuitry 100 includes a reference signal generator 102, a frequency doubler 104, an equalizer 106, a frequency doubler 108, an equalizer 110, and a phase locked loop (PLL) 130. Reference signal generator 102 may include conventional circuitry, such as a crystal oscillator. An input of frequency doubler 104 is coupled to an output of reference signal generator 102, and an output of frequency doubler 104 is coupled to an input of equalizer 106. Similarly, an input of frequency doubler 108 is coupled to an output of equalizer 106, and an output of frequency doubler 108 is coupled to an input of equalizer 110. Equalizer 110 has an output which is fed into an input of PLL 130.

Each one of frequency doublers 104 and 108 has the structure and functionality as shown and described in relation to FIGS. 2 and 3A–3C. In addition, each one of equalizers 106 and 110 of FIG. 1 has the structure and function as shown and described in relation to FIG. 4.

PLL 130 of FIG. 1 includes a frequency phase detector 112, a filter and voltage-controlled oscillator (VCO) 114, and a divider 116. Frequency phase detector 112 has a first input coupled to the output of equalizer 110 and an output coupled to an input of filter and VCO 114. Although shown as a single block, filter and VCO 114 consists of a filter coupled in series with a VCO where an output of the filter is coupled to an input of the VCO. An output of filter and VCO 114 is coupled to an input of divider 116, which has an output coupled to a second input of frequency phase detector 112.

Referring now to FIG. 2, a schematic block diagram of frequency doubler 104 of FIG. 1 is shown. Frequency doubler 104 includes a delay circuit 202, a delay circuit 204, a multiplexer 206, and an XOR circuit 210. Delay circuit 202 is configured to provide a 90° delay for a particular frequency X. Together, delay circuits 202 and 204 are configured to provide a 90° delay for a different frequency Y, where each delay circuit 202 and 204 provides a 45° delay for the frequency Y.

Delay circuit 202 has an input which is the input to frequency doubler 104, and an output coupled to both an input of delay circuit 204 and a first input of multiplexer 206. Delay circuit 204 has an output coupled to a second input of multiplexer 206. A first input of XOR circuit 210 is coupled to an output of multiplexer 206, and a second input of XOR circuit 210 is coupled to the input of frequency doubler 104. A signal selection input 212 to multiplexer 206 is used for selectively coupling one of the first and the second inputs of multiplexer 206 to its output.

FIG. 4 is a schematic block diagram of equalizer 106 of FIG. 1. Equalizer 106 includes an equalizer. 402, an equalizer 404, and a multiplexer 406. Equalizers 402 and 404 may be referred to as "subequalizers" of equalizer 106. Inputs of equalizers 402 and 404 are coupled to the input of equalizer 106. Each one of equalizers 402 and 404 is a duty cycle equalizer utilizing conventional circuitry. More particularly, equalizer 402 is designed and tailored for use with a first reference signal having a frequency X, whereas equalizer 404 is designed and tailored for use with a second reference signal having a frequency Y which is different from frequency X. Multiplexer 406 has a first input coupled to an output of equalizer 402, and a second input coupled to an output of equalizer 404. A signal selection input 408 to multiplexer 406 is used for selectively coupling one of the first and the second inputs of multiplexer 406 to its output. The output of multiplexer 406 is the output of equalizer 106 of FIG. 1.

Figure 5:
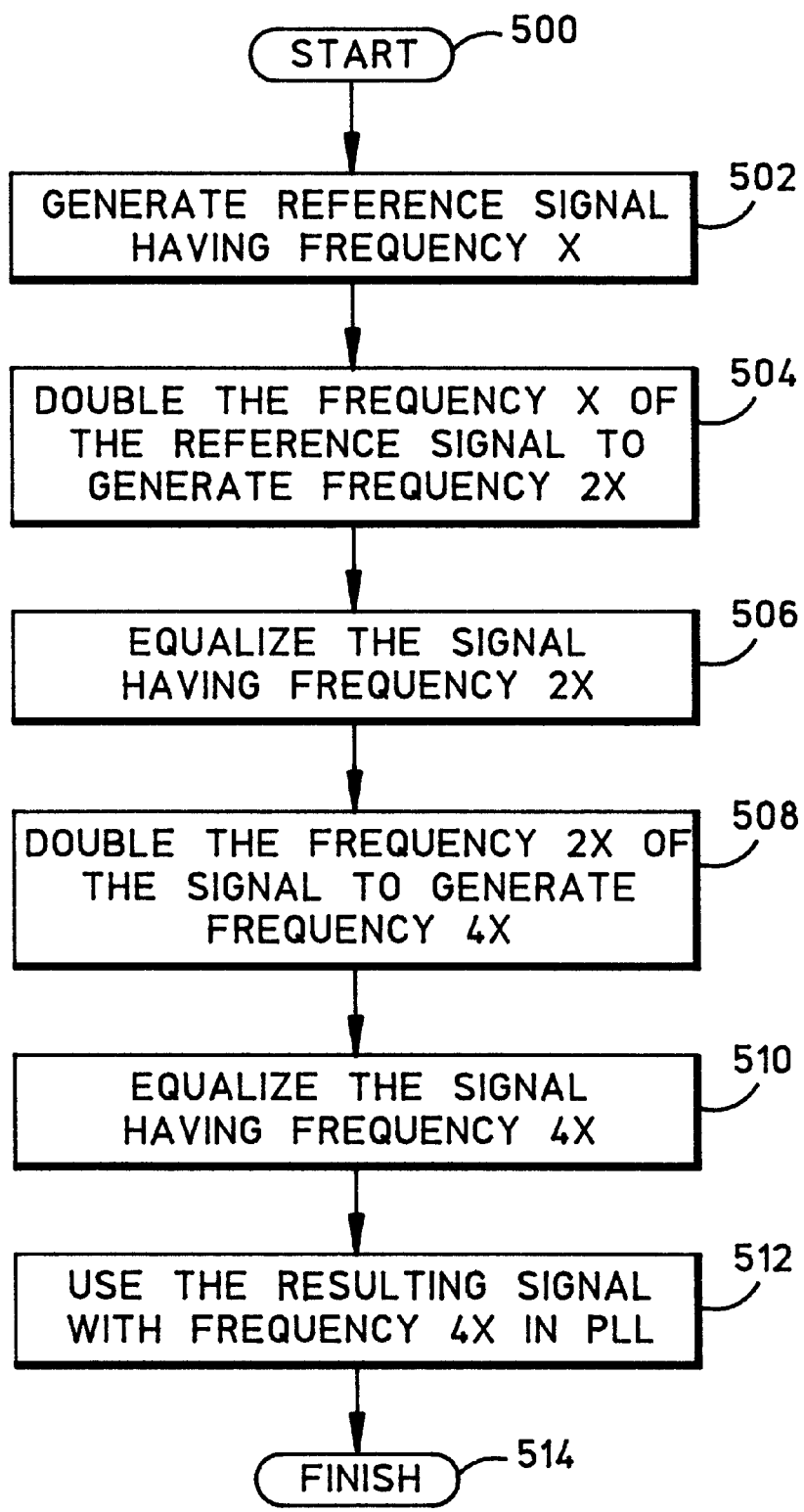
FIG. 5 is a flowchart describing a method of producing a reference frequency signal using the circuitry shown in FIG. 1.

FIG. 5 is a flowchart describing a method of producing a reference signal, which can be performed using circuitry 100 shown and described in relation to FIGS. 1, 2, and 4. In the following description, FIGS. 1 and 5 will be referred to in combination. Beginning at a start block 500 of FIG. 5, a reference signal having a frequency X is generated by reference signal generator 102 (step 502). Frequency X may be, for example, about 155 MHz. Next, the frequency X of the reference signal is doubled by frequency doubler 104 to produce a signal having a frequency 2*X (step 504). Frequency 2*X may be, for example, about 210 MHz. This signal is equalized by equalizer 106 (step 506).

Steps 504 (frequency doubling) and 506 (equalizing) are basically repeated in steps 508 and 510. More particularly, the equalized signal having frequency 2*X is doubled by frequency doubler 108 to produce a signal having a frequency 4*X (step 508). Frequency 4*X may be, for example, about 622 MHz. This resulting signal is then equalized by equalizer 110 (step 510). Finally, the equalized signal having frequency 4*X is used in PLL 130 (step 512). The flowchart ends at a finish block 514, but the method repeats continuously for a continuously applied reference signal from reference signal generator 102. Furthermore, since circuitry 100 is configured to handle a reference signal with two or more different predetermined frequencies (which will be described in more detail below), the method as shown and described in relation to FIG. 5 may be continuously repeated for a different reference signal having a frequency different than frequency X (e.g., a reference signal having a frequency Y).

Operation of circuitry 100 of FIG. 1 is described in more detail for a first reference signal having the frequency X. Referring back to FIG. 2, selection signal input 212 of multiplexer 206 is set such that the first (top) input is selected as the output of multiplexer 206 and the second (bottom) input is ignored. The first reference signal at a line 118 is received at the input of delay circuit 202 and at the input of XOR circuit 210 at a line 216. This first reference signal is delayed by delay circuit 202 so that a first out-of-phase signal is produced at the output of delay circuit 202 at a line 218. The first out-of-phase signal is passed through multiplexer 206 at its output at a line 214. Thus, the output of XOR circuit 210 is the XOR of the first reference signal having frequency X at line 216 and the first out-of-phase signal having frequency X at line 214.

Referring to FIG. 3A, a signal 302 representing the first reference signal at lines 118 and 216 is shown. In FIG. 3B, a signal 304 representing the first out-of-phase signal at line 214 is shown. Since delay circuit 202 of FIG. 2 is configured as a 90° delay circuit for frequency X, signal 304 of FIG. 3B is 90° out-of-phase with signal 302 of FIG. 3A. In FIG. 3C, a resulting signal 306 at line 120 which is the XOR of the two aforementioned signals is shown. As illustrated, resulting signal 306 has a frequency 2*X.

For the first reference signal having the frequency X, the output of equalizer 402 of FIG. 4 is selected at signal selection input 408 to be coupled to the output of multiplexer and line 122. As described earlier, equalizer 402 is particularly designed and tailored for use with the first reference signal having the frequency X.

Operation of circuitry 100 of FIG. 1 is now described in more detail for a second reference signal having a frequency Y that is different from frequency X. For this embodiment, frequency Y is less than frequency X. Frequency Y may be, for example, 78 MHz. Referring back to FIG. 2, selection signal input 212 of multiplexer 206 is set such that the second (bottom) input is selected as the output of multiplexer 206 and the first (top) input is ignored. The second reference signal at line 118 is received at the input of delay circuit 202 and at the input of XOR circuit 210 at line 216. This second reference signal is delayed by delay circuit 202 so that the first out-of-phase signal is produced at the output of delay circuit 202 at line 218, but the first out-of-phase signal is also delayed by delay circuit 204 so that a second out-of-phase signal is produced at its output at a line 220. The second out-of-phase signal is passed through multiplexer 206 at its output at line 214. Delay circuit 204 is configured as a 45° delay circuit for frequency Y and, since delay circuit 202 is also configured as a 45° delay circuit for frequency Y, the resulting signal has a total delay of 90°. The output of XOR circuit 210 is the XOR of the second reference signal having frequency Y at line 216 and the second out-of-phase signal having frequency Y at line 214.

For the second reference signal having the frequency Y, the output of equalizer 404 of FIG. 4 is selected at signal selection input 408 to be coupled to the output of multiplexer and line 122. As described earlier, equalizer 404 is particularly designed and tailored for use with the second reference signal having the frequency Y.

As one skilled in the art will readily understand, circuitry of frequency doubler 104 of FIG. 2 may be expanded using additional delay circuits and multiplexer inputs for handling additional reference frequencies. On the other hand, if a reference signal having only a single predetermined frequency is to be utilized and outputted from reference signal generator 102 of FIG. 1, then delay circuit 204 and multiplexer 206 of FIG. 2 are not necessary and can be excluded. In this case, the output of delay circuit 202 is coupled directly to the first input of XOR circuit 210. Likewise, in this case multiplexer 406 and one of equalizers 402 and 404 of FIG. 4 are not necessary for equalizer 106 and can be-excluded.

Several advantages are conferred with use of the present invention. Conventional XOR-based frequency doublers typically distort the duty cycle of the signal waveform over the process corners of IC fabrication. In the present invention, however, the first equalizer helps restore the duty cycle of the signal before it enters the second frequency doubler, and the second equalizer helps restore the duty cycle before the signal enters the frequency phase detector of the PLL. This increased (quadrupled) reference frequency at the input of the frequency phase detector allows the PLL to have a smaller feedback divider ratio and therefore fewer dividers; fewer dividers result in less circuitry in the PLL feedback path and reduces jitter. A reduced divider ratio also allows a higher loop gain for a given supply voltage, which produces a more ideal gain distribution for noise and reduces jitter as well.

Thus, an inventive reference signal generator suitable for use with a PLL has been described herein. The reference signal generator may include a first frequency doubler; a first equalizer having an input coupled to an output of the first frequency doubler; a second frequency doubler having an input coupled to an output of the first equalizer; a second equalizer having an input coupled to an output of the second frequency doubler; and an output of the second equalizer for coupling to an input of the PLL. The PLL may include a frequency phase detector having a first input coupled to the output of the second equalizer; a filter having an input coupled to an output of the frequency phase detector; a voltage-controlled oscillator (VCO) having an input coupled to an output of the filter; and a divider having an input coupled to an output of the VCO and an output coupled to a second input of the frequency phase detector.

Each one of the first and the second frequency doublers includes a first delay circuit comprising an input of the frequency doubler; a first XOR circuit having a first input coupled to an output of the first delay circuit and a second input coupled to the input of the frequency doubler; and an output of the first XOR circuit comprising the output of the frequency doubler. The first delay circuit is configured to provide a 90° delay for a first reference signal.

Each one of the frequency doublers also includes a second delay circuit having an input coupled to the output of the first delay circuit; and a multiplexer including a first input coupled to the output of the first delay circuit; a second input coupled to an output of the second delay circuit; an output coupled to the first input of the first XOR circuit; and a signal selection input for selecting one of the first and the second inputs of the multiplexer to be provided at the output of the multiplexer. The first and second delay circuits are together configured to provide a 90° delay for a second reference signal.

In addition, an inventive method described herein includes the acts of receiving a first reference signal having a frequency X; doubling the frequency X of the first reference signal to produce a second reference signal having a frequency 2*X; equalizing the second reference signal to produce an equalized second reference signal; doubling the frequency 2*X of the equalized second reference signal to produce a third reference signal having a frequency 4*X; and equalizing the third reference signal to produce an equalized third reference signal for use in a PLL.

The act of doubling the frequency X (and/or the frequency 2*X) of the first (and/or second) reference signal includes the additional acts of delaying the first (and/or second) reference signal to produce a first (and/or second) out-of-phase signal; and XORing the first (and/or second) reference signal and the first (and/or second) out-of-phase signal to produce the second (and/or third) reference signal having the frequency 2*X (and/or the frequency 4*X). The act of equalizing serves to reduce duty cycle distortion caused by the act of XORing the first (and/or second) reference signal and the first (and/or second) out-of-phase signal. The act of delaying the first (and/or second) reference signal to produce the first (and/or second) out-of-phase signal also includes delaying the first (and/or second) reference signal by 90°. It is to be understood that the above is merely a description of preferred embodiments of the invention and that various changes, alterations, and variations may be made without departing from the true spirit and scope of the invention as set for in the appended claims. None of the terms or phrases in the specification and claims has been given any special particular meaning different from the plain language meaning to those skilled in the art, and therefore the specification is not to be used to define terms in an unduly narrow sense.

What is claimed is:

1. A method of producing a reference signal for use with a phase locked loop (PLL), the method comprising the acts of:
    receiving a first reference signal having a frequency X;
    doubling the frequency X of the first reference signal to produce a second reference signal having a frequency 2*X;
    equalizing the second reference signal to produce an equalized second reference signal;
    doubling the frequency 2*X of the equalized second reference signal to produce a third reference signal having a frequency 4*X; and
    equalizing the third reference signal to produce an equalized third reference signal for use in a phase locked loop (PLL).

2. The method of claim 1, wherein the act of doubling the frequency X of the first reference signal further comprises the acts of:
    delaying the first reference signal to produce a first out-of-phase signal; and
    XORing the first reference signal and the first out-of-phase signal to produce the second reference signal having the frequency 2*X.

3. The method of claim 2, wherein the act of equalizing serves to reduce duty cycle distortion caused by process variations.

4. The method of claim 2, wherein the act of delaying the first reference signal to produce the first out-of-phase signal comprises the further act of:
    delaying the first reference signal by 90°.

5. The method of claim 2, wherein the act of doubling the frequency X of the first reference signal further comprises the acts of:
    delaying the first reference signal to produce a first out-of-phase signal;
    delaying the first out-of-phase signal to produce a second out-of-phase signal; and
    XORing the first reference signal and the second out-of-phase signal to produce the second reference signal having the frequency 2*X.

6. The method of claim 2, wherein the act of doubling the frequency 2*X of the second reference signal further comprises the acts of:
    delaying the second reference signal to produce a second out-of-phase signal; and
    XORing the second reference signal and the second out-of-phase signal to produce the third reference signal having the frequency 4*X.

7. A reference signal generator suitable for use with a phase locked loop (PLL), comprising:
   a first frequency doubler;
   a first equalizer having an input coupled to an output of the first frequency doubler;
   a second frequency doubler having an input coupled to an output of the first equalizer;
   a second equalizer having an input coupled to an output of the second frequency doubler; and
   an output of the second equalizer for coupling to an input of a phase locked loop (PLL).

8. The reference signal generator of claim 7, wherein the PLL further comprises:
   a frequency phase detector having a first input coupled to the output of the second equalizer;
   a filter having an input coupled to an output of the frequency phase detector;
   a voltage-controlled oscillator (VCO) having an input coupled to an output of the filter; and
   a divider having an input coupled to an output of the VCO and an output coupled to a second input of the frequency phase detector.

9. The reference signal generator of claim 7, wherein each one of the first and the second frequency doublers further comprises:
   a first delay circuit comprising an input of the frequency doubler;
   a first XOR circuit having a first input coupled to an output of the first delay circuit and a second input coupled to the input of the frequency doubler; and
   an output of the first XOR circuit comprising the output of the frequency doubler.

10. The reference signal generator of claim 9, wherein the first delay circuit is configured to provide a 90° delay for a first reference signal.

11. The reference signal generator of claim 9, wherein the frequency doubler further comprises:
   a second delay circuit having an input coupled to the output of the first delay circuit; and
   a multiplexer, including:
      a first input coupled to the output of the first delay circuit;
      a second input coupled to an output of the second delay circuit;
      an output coupled to the first input of the first XOR circuit; and
      a signal selection input for selecting one of the first and the second inputs of the multiplexer to be provided at the output of the multiplexer.

12. The reference signal generator of claim 11, wherein the first and the second delay circuit are configured to provide a 90° delay for a second reference signal.

13. The reference signal generator of claim 11, wherein the first and the second equalizers are duty cycle equalizers.

14. The reference signal generator of claim 11, wherein the first equalizer further comprises:
   a first subequalizer having an input comprising the input of the equalizer;
   a second subequalizer having an input comprising the input of the equalizer; and
   a multiplexer, including:
      a first input coupled to an output of the first subequalizer;
      a second input coupled to an output of the second subequalizer;
      an output comprising the output of the equalizer; and
      a signal selection input for selecting one of the first and the second inputs of the multiplexer to be provided at the output of the multiplexer.

15. An integrated circuit (IC), comprising:
   a reference frequency quadrupler, including:
      a first frequency doubler;
         a first equalizer having an input coupled to an output of the first frequency doubler circuit;
      a second frequency doubler having an input coupled to an output of the first equalizer;
      a second equalizer having an input coupled to an output of the second frequency doubler;
      each one of the first and the second frequency doublers further including:
         a first delay circuit having an input comprising the input of the frequency doubler;
         a first XOR circuit having a first input coupled to an output of the first delay circuit, a second input coupled to the frequency doubler, and an output comprising the output to the frequency doubler;
   a phase locked loop (PLL), including:
      a frequency phase detector having a first input coupled to the output of the second equalizer;
      a filter having an input coupled to an output of the frequency phase detector;
      a voltage-controlled oscillator (VCO) having an input coupled to an output of the filter;
      a divider having an input coupled to an output of the VCO and an output coupled to a second input of the frequency phase detector.

16. The IC of claim 15, wherein the first delay circuit is configured to provide a 90° delay for a first reference signal.

17. The IC of claim 15, wherein each one of the first and the second frequency doublers further comprises:
   a second delay circuit having an input coupled to the output of the first delay circuit; and
   a multiplexer, including:
      a first input coupled to the output of the first delay circuit;
      a second input coupled to an output of the second delay circuit;
      an output coupled to the first input of the first XOR circuit; and
      a signal selection input for selecting one of the first and the second inputs of the multiplexer to be provided at the output of the multiplexer.

18. The IC of claim 15, wherein the first and the second delay circuits are configured to provide a 90° delay for a second reference signal.

19. The IC of claim 15, wherein the first and the second equalizers are duty cycle equalizers.

20. The IC of claim 15, wherein the first equalizer further comprises:
   a first subequalizer having an input comprising the input of the equalizer;
   a second subequalizer having an input comprising the input of the equalizer; and
   a multiplexer, including:
      a first input coupled to an output of the first subequalizer;
      a second input coupled to an output of the second subequalizer;
      an output comprising the output of the equalizer; and
      a signal selection input for selecting one of the first and the second inputs of the multiplexer to be provided at the output of the multiplexer.

* * * * *

UNITED STATES PATENT AND TRADEMARK OFFICE
CERTIFICATE OF CORRECTION

PATENT NO. : 6,538,520 B1
DATED : March 25, 2003
INVENTOR(S) : Merril et al.

It is certified that error appears in the above-identified patent and that said Letters Patent is hereby corrected as shown below:

<u>Title page,</u>
Item [56], References Cited, U.S. PATENT DOCUMENTS, please add:

```
-- 4,596,954    06/86    Haque
   5,530,387    05/96    Kim
   5,635,866    06/97    Monk et al
   5,963,071    10/99    Dowlatabadi --
```

Signed and Sealed this

Sixteenth Day of December, 2003

JAMES E. ROGAN
*Director of the United States Patent and Trademark Office*